United States Patent [19]
Chen

[11] Patent Number: 6,071,777
[45] Date of Patent: Jun. 6, 2000

[54] METHOD FOR A SELF-ALIGNED SELECT GATE FOR A SPLIT-GATE FLASH MEMORY STRUCTURE

[75] Inventor: Bin Shing Chen, Hsinchu, Taiwan

[73] Assignee: Winbond Electronics Corporation, Taiwan

[21] Appl. No.: 09/301,324

[22] Filed: Apr. 29, 1999

[51] Int. Cl.[7] .................................................. H01L 21/336
[52] U.S. Cl. .......................... 438/257; 438/305; 438/366
[58] Field of Search .................................... 438/262–263, 438/264, 265, 266, 286, 301, 257, 258, 303, 305, 306, 366, 595, 724, 734, 744, 751, 757

[56] References Cited

U.S. PATENT DOCUMENTS

| | | | |
|---|---|---|---|
| 5,242,848 | 9/1993 | Yeh | 437/43 |
| 5,702,965 | 12/1997 | Kim | 47/43 |
| 5,970,371 | 10/1999 | Hsieh et al. | 438/593 |
| 6,001,690 | 12/1999 | Chien et al. | 438/266 |

*Primary Examiner*—Matthew Smith
*Assistant Examiner*—Robert Hullinger
*Attorney, Agent, or Firm*—Finnegan, Henderson, Farabow, Garrett & Dunner, L.L.P.

[57] ABSTRACT

A process for making a self-aligned select gate for a split-gate flash memory structure uses a patterned nitride layer and a photoresist layer to serve as masks to define a select gate length, facilitates a self-aligned ion implantation to form a drain region of a memory cell, and defines a distance between the select gate and the drain region.

8 Claims, 5 Drawing Sheets

METHOD FOR A SELF-ALIGNED SELECT GATE FOR A SPLIT-GATE FLASH MEMORY STRUCTURE

BACKGROUND OF THE INVENTION

1. Field of the Invention

The present invention relates generally to a semiconductor device and process and, more particularly, to a device and method for making a self-aligned select gate for a split-gate flash memory structure.

2. Description of the Related Art

Traditionally, flash memory cells consist of a floating storage gate (i.e., material which is not electrically connected to any terminal) interposed between a select gate and the area of the silicon substrate that is the channel of the memory cell transistor. Erasing, writing, or reading of such a cell involves injecting or removing electrons to or from the floating gate. Applying different combinations of voltages on its control gate, source, drain, and substrate controls this erasing, writing and reading of the cell. To enhance cell performance, split gates are sometimes used. In such a device, either different gates are used for the erasing/writing and reading operations, or these operations are performed using different regions of the same gate structure.

For a split-gate non-volatile memory (NVM) to operate properly, it is necessary for the select gate to at least cover the distance between the drain region (or source region) and the floating gate. If this distance is not constant, the length of the select gate must overcompensate for the variance in distance to ensure the split-gate NVM operates properly. A process for making a split-gate NVM design which does not maintain this distance constant is referred to as a non-self-aligned split-gate process because the alignment of the drain region and the floating gate must be taken into consideration when forming the select gate. Due to the overcompensation in the select gate length, a non-self-aligned split gate process deters cell size scaling. Moreover, cell characteristics, such as program efficiency and cell current, are severely affected by misalignment, which may occur in a non-self-aligned gate process. Another problem is that asymmetrical programming, resulting from misalignment of the select gate, may disturb the immunity margin due to a larger threshold leakage for a shorter select gate length.

SUMMARY OF THE INVENTION

Accordingly, the present invention is directed to a process for manufacturing a split-gate non-volatile memory device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and consistent with the purpose of the invention as embodied and broadly described, there is provided a process for manufacturing a memory device including forming an insulating layer over a semiconductor substrate of a first conductivity type, forming a first polysilicon layer over the insulating layer, forming a nitride layer over the first polysilicon layer such that first and second portions of the first polysilicon layer are exposed, and forming first and second insulating regions on the first and second exposed portions, respectively, of the first polysilicon layer. The first insulating region and the first portion of the first polysilicon layer are then removed such that a first portion of the insulating layer below the first portion of the first polysilicon layer is exposed to allow an impurity region of a second conductivity type to be formed in the semiconductor substrate below the first portion of the insulating layer. Subsequently, the nitride layer is removed, and the first polysilicon layer is etched such that only the second portion of the first polysilicon layer below the second insulating region remains.

Both the foregoing general description and the following detailed description provide examples and explanations only. They do not restrict the claimed invention.

DESCRIPTION OF THE DRAWINGS

The accompanying drawings, which are incorporated in and constitute a part of this specification, illustrate embodiments of the invention and, together with the description, explain the advantages and principles of the invention. In the drawings.

DETAILED DESCRIPTION

Figure 1A:
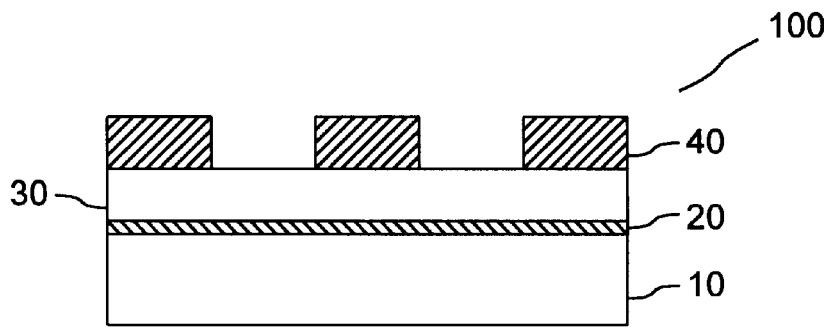
FIGS. 1A–1K are cross-sectional views illustrating a method of manufacturing a non-volatile memory having a split-gate structure consistent with the present invention.

Reference will now be made to preferred embodiments of this invention, examples of which are shown in the accompanying drawings and will be obvious from the description of the invention. In the drawings, the same reference numbers represent the same or similar elements in the different drawings whenever possible.

In the process for producing a split-gate non-volatile memory device consistent with the present invention, the position and length of the select gate and its position relative to that of the drain of the associated memory device are "self-aligned" (automatically aligned with respect to each other). This automatic self-alignment facilitates shrinkage of the cell as new memory generations are developed. The self-alignment is accomplished because the positions of both the floating gate and the drain are determined by the same photo mask.

FIG. 1A shows an initial structure of a semiconductor device in a method of manufacturing a non-volatile memory cell 100 consistent with the present invention. As shown in FIG. 1A, in an early stage of the manufacturing method, cell 100 includes a substrate 10, a tunneling oxide 20 formed over substrate 10, a polysilicon layer 30 formed over tunneling oxide 20, and a nitride layer 40 formed over polysilicon layer 30.

Substrate 10 can be either a p-type or n-type semiconductor material. Tunneling oxide 20 is a thin oxide through which cell 100 is programmed (electrons forced on to the floating gate, described herein). Tunneling oxide 20 can be formed to a thickness of approximately 50 to 150 Å and at a temperature of about 900° C. Polysilicon layer 30, which is deposited over tunneling oxide 20, can be deposited from a gas such as $SiH_4$ with a thickness of approximately 500 to 2500 Å at a temperature of about 620° C. In addition, polysilicon layer 30 is doped with an impurity, such as phosphorus ions, that are ion implanted at a concentration of about $1\times10^{19} cm^{-3}$.

Nitride layer 40 is deposited over polysilicon layer 30, and is used as a mask to control where oxide will grow in subsequent steps. Nitride layer 40 can be formed of, for example, silicon nitride ($Si_3N_4$) using a low pressure chemical vapor deposition (LP-CVD) process at a temperature of about 780° C. In addition, nitride layer 40 may be formed to a thickness of approximately 500 to 2000 Å. As shown in FIG. 1A, nitride layer 40 is patterned such that the areas where material in nitride layer 40 is removed correspond to where the floating gate and the drain of cell 100 will be formed.

Figure 1B:
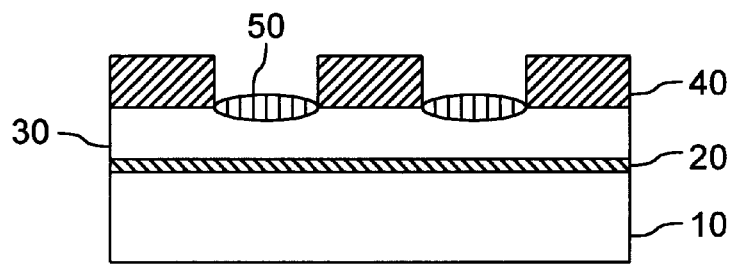

In FIG. 1B, polysilicon layer 30 is oxidized, using nitride layer 40 as a mask, to form oxide regions 50. Oxide regions 50 can be formed by either growing the oxide layer on the exposed portions of polysilicon layer 30, such as by thermal oxidation, or by depositing an oxide layer over these portions, such as by CVD. If oxide regions 50 are formed by a CVD process, it may be necessary to have an additional chemical-mechanical polishing (CMP) process to remove the oxide on top of nitride layer 40. If oxide regions 50 are formed by thermal oxidation, the thickness of the regions should preferably be greater than 100 Å. In the case of formation by thermal oxidation, the temperature used to form oxide regions 50 is not critical.

Figure 1C:
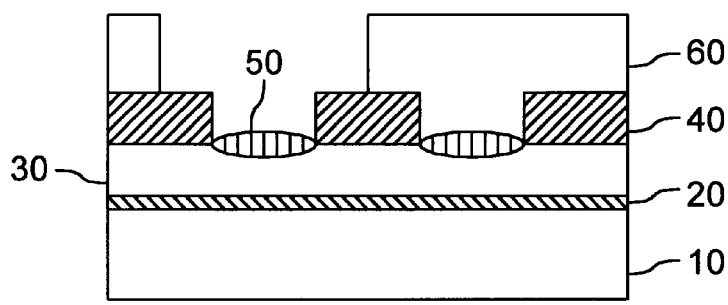
Figure 1D:
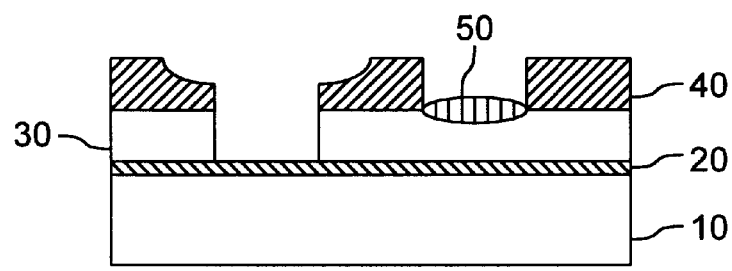

After forming oxide regions 50, a photoresist 60 is formed leaving only one of oxide regions 50 exposed, as shown in FIG. 1C. Using photoresist 60 and nitride layer 40 as a mask, both the exposed oxide region 50 and the region of polysilicon layer 30 below the exposed oxide region 50 are etched away, as shown in FIG. 1D. In addition, as shown in FIG. 1D, a part of exposed nitride layer 40 is removed during the etch of polysilicon layer 30 and oxide region 50. Photoresist 60 is then removed. As a result of the etching, a portion of tunneling oxide layer 20 is left exposed in the region where oxide region 50 and polysilicon layer 30 were removed.

Figure 1E:
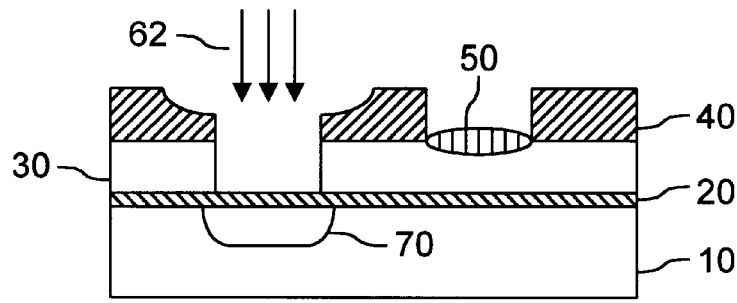

Continuing to use nitride layer 40 as a mask, a doping by ion implantation 62 is performed to form a drain region 70 under the exposed portion of tunneling oxide layer 20, as shown in FIG. 1E. The material used to dope substrate 10 to form drain region 70 depends on the type of material from which substrate 10 is formed. For example, if substrate 10 is p-type, drain region 70 can be formed by doping substrate 10 an n-type dopant, such as phosphorus. Conversely if substrate 10 is n-type, drain region 70 can be formed by doping substrate 10 with a p-type dopant, such as boron.

Before the ion implantation of the drain, a drain oxidation step may optionally be performed. This oxidation serves the following purposes. First, it increases the oxide thickness at the drain region, which prevents the formation of a silicon trench during the following etch of polysilicon layer 30, described below. In addition, the drain oxidation prevents an implant channeling effect.

Figure 1F:
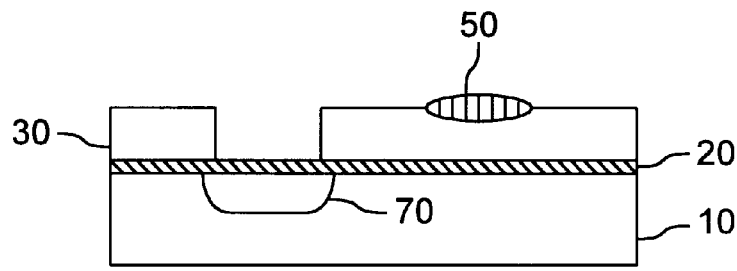
Figure 1G:
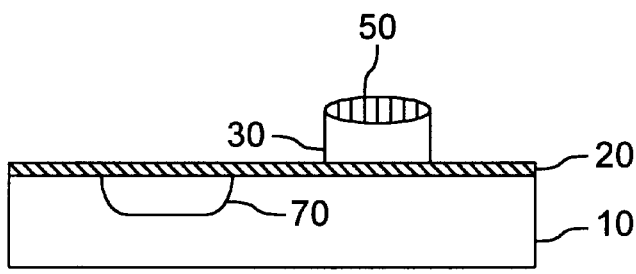

After the implantation of substrate 10 to form drain region 70 is complete, nitride layer 40 is removed, as shown in FIG. 1F. Nitride layer 40 can be removed using a wet etch process, such as with $H_3PO_4$. Then, using the remaining oxide region 50 as a mask, polysilicon layer 30 is etched so that the only remaining part of polysilicon layer 30 is the region under oxide region 50, as shown in FIG. 1G. This remaining region of polysilicon layer 30 serves as the floating gate for the non-volatile memory.

Next, an oxide layer 80 can be thermally grown on the exposed sidewalls of polysilicon layer 30. Alternatively, oxide layer 80 can be deposited by a CVD process over the entire exposed surface of the non-volatile memory, and then etched to leave oxide layer 80 only on the sidewalls of polysilicon layer 30. Oxide layer 80 can also be formed as a composite layer of oxide/nitride or oxide/nitride/oxide (ONO). When forming an oxide/nitride composite layer, for example, the oxide may be thermally grown to form an oxide sidewall. Then, a thin layer of nitride is deposited non-selectively. Following the deposition of nitride, anisotropic etching of the nitride leaves a sidewall having a oxide/nitride spacer. If oxide layer 80 is thermally grown, the oxidation temperature is preferably between 800 and 1000° C. The thickness of oxide layer 80 can be approximately 100–800 Å if it is a pure oxide. For the oxide/nitride composite, the thickness of the oxide layer and the nitride layer are each preferably about 50 to 300 Å. For the ONO composite, both the top and bottom oxide layers can be approximately 30 to 200 Å, and the nitride layer can have a thickness of approximately 50 to 300 Å.

Figure 1H:
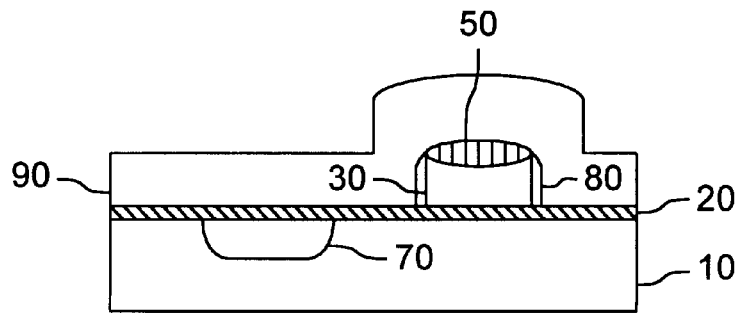

Having formed oxide layer 80, a polysilicon layer 90 is then deposited over the exposed surface of tunneling oxide 20, oxide layer 80, and oxide region 50, as shown in FIG. 1H. Polysilicon layer 90, after etching, serves as the select gate for cell 100. Polysilicon layer 90 can be formed of pure polysilicon or a polycide. The thickness of polysilicon layer 90 is preferably between 1000 and 4000 Å. The doping concentration for the pure polysilicon or the underlying polysilicon in a polycide should preferably be greater than $5\times10^{19} cm^{-3}$.

Figure 1I:
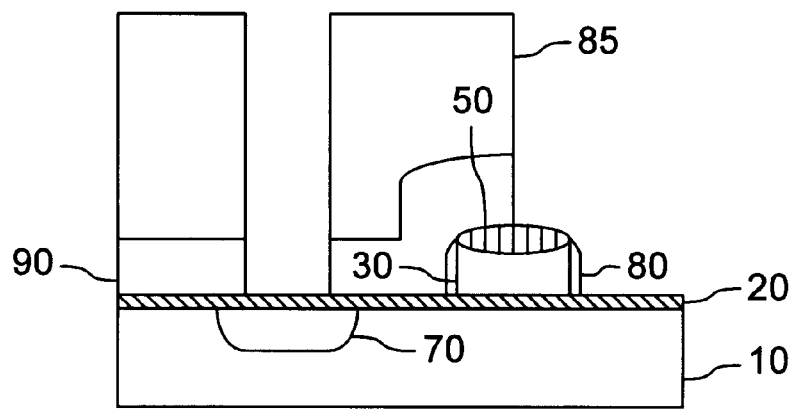
Figure 1J:
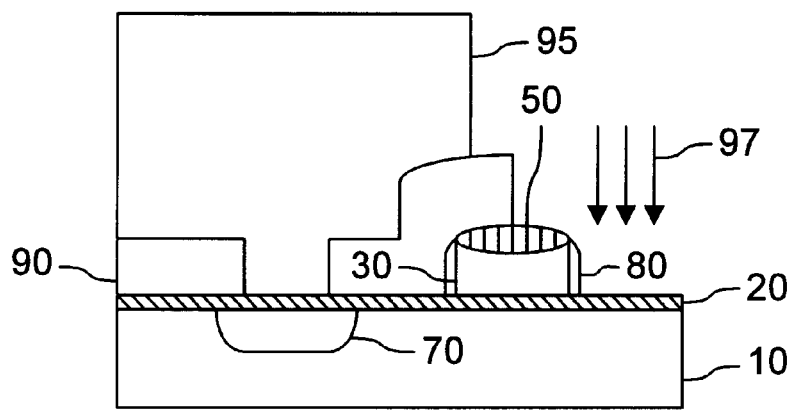
Figure 1K:
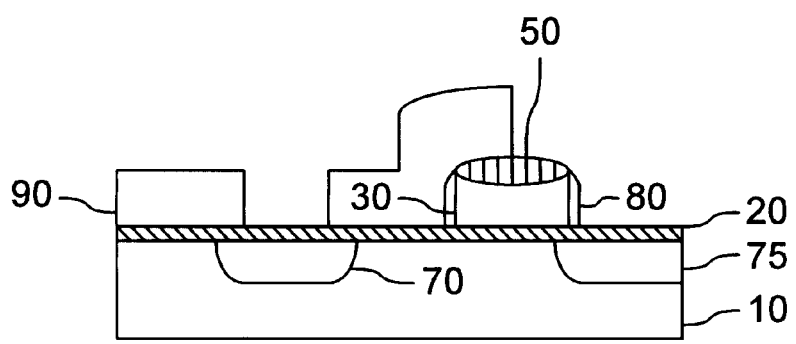

As shown in FIG. 1I, polysilicon layer 90 is etched using a photoresist layer 85 as a mask. Polysilicon layer 90 is etched so that a portion of the layer overlaps drain region 70 on both sides of the drain. After removing photoresist layer 85, another photoresist layer 95 shown in FIG. 1J is formed and used as a mask for an ion implantation 97 for implanting a source region 75 (shown in FIG. 1K). The material used to dope substrate 10 to form source region 75 is preferably the same as the material used to form drain region 70, and likewise Depends upon the conductivity type of substrate 10. FIG. 1K shows source region 75 after the ion implantation and the removal of photoresist layer 95. As shown in FIG. 1K, the ion implantation for forming source region 75 diffuses in substrate 10 such that polysilicon layer 30 partially overlaps source region 75.

Figure 2A:
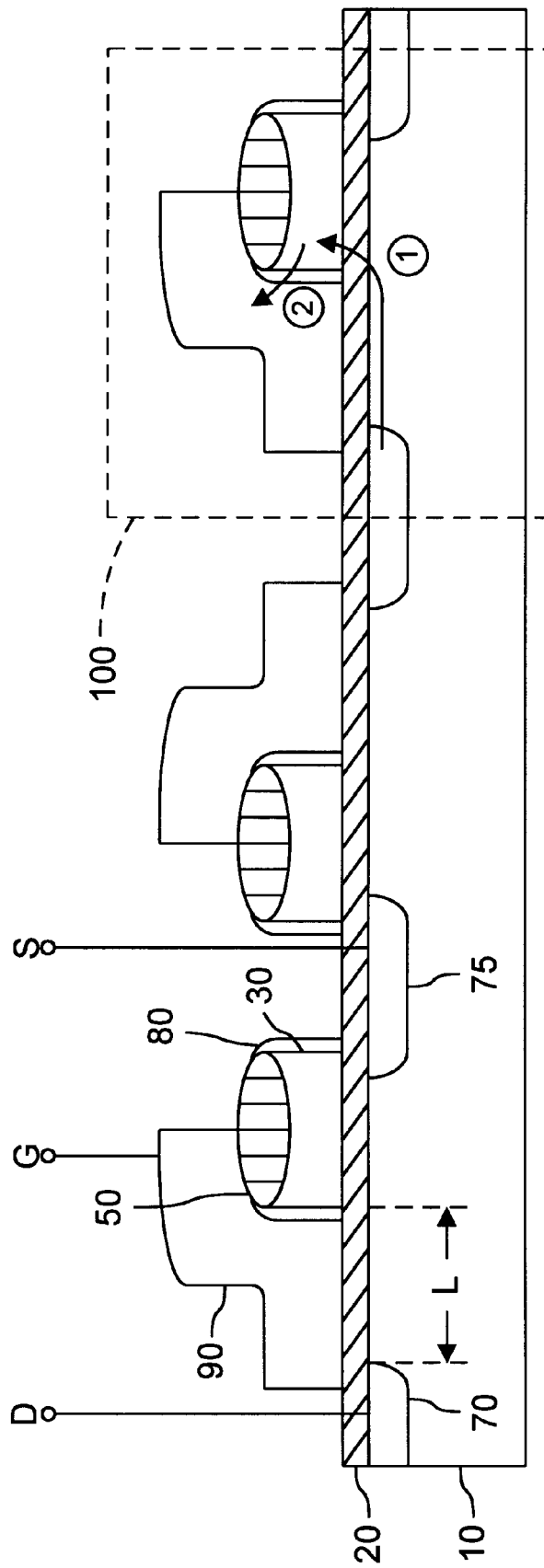
FIG. 2A is a cross-sectional view of a complete non-volatile memory having a split-gate structure consistent with the present invention.
Figure 2B:
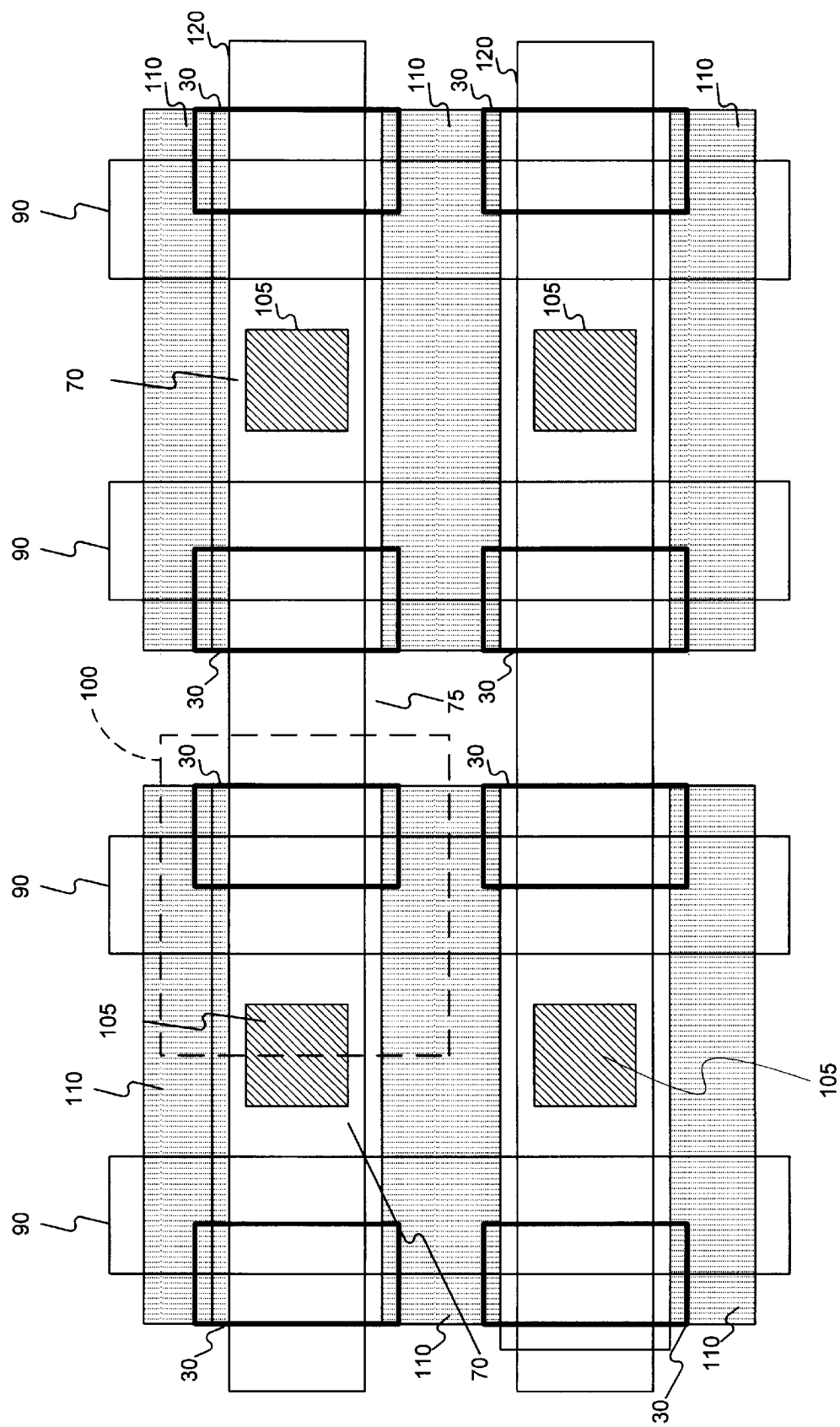
FIG. 2B is a plan view of a cell layout of a non-volatile memory having a split-gate structure consistent with the present invention.

FIG. 2A shows a complete cross-sectional view of cell 100 and adjacent cells. FIG. 2B shows a plan view of a cell layout of a cell 100 in an array of cells that includes isolation regions 110, such as field oxide regions, for isolating adjacent rows of cells. The isolation regions 110 can be formed by a thermally-grown oxide process, for example LOCOS or PBLOCOS, or can be formed using a shallow trench. If a process used to form isolation regions 110 leaves oxide over source regions 75, then a selective etching is performed to remove the excess; oxide. Metal regions 120 are also provided for providing an electrical path for each of the rows of the array. Some conventional portions of the array have not been illustrated for the sake of clarity.

As shown in FIG. 2A, cell 100 includes all of the elements shown in FIG. 1K. A cell consistent with the present invention, such as cell 100 shown in FIG. 2A, is programmed by injecting charge into a floating gate, which is formed from polysilicon layer 30, from the channel of the cell. The channel is formed between drain region 70 and source region 75. In FIG. 2A, the arrow labeled 1 shows the path of the charge from drain region 70, through the channel and into polysilicon layer 30. The charge is injected into the floating gate by applying the appropriate potentials to drain region 70, source region 75 and polysilicon layer 90, which serves as the select gate. Contact region 105, as shown in FIG. 2B, can be used to apply the potential to the drain region. For example, when programming cell 100, the applied voltages cain be 2V at the select gate, 0.6V at the drain, 12V at the source, and 0V at the substrate.

To erase the cell, charge is removed from polysilicon layer 30 through thin sidewall oxide layer 80 onto the select gate formed from polysilicon layer 90. This path through sidewall oxide layer 80 is shown in FIG. 2A by the arrow labeled 2. The erasing of the cell to remove the charge from polysilicon layer 30 is initiated by changing the potentials applied to drain region 70, source region 75 and polysilicon layer 90. To erase cell 100, the applied voltages can be, for example, 14V at the select gate and 0V at the drain, source and substrate.

Any applicable manner of formation of the cell contacts is sufficient. For example, one manner of forming contacts includes depositing an inter-layer dielectric, planarizing the deposited dielectric using, for example, CMP or SOG etching, depositing a photoresist to mask portions other than portions to form contact portions, etching the exposed areas to define the contact portions, depositing a metal, for example tungsten W, over the device including into the contact portions, and etching the device to remove the metal from portions other than the contact portions. With respect to the source pick-up, a source contact can be provided every 2, 4, 8, 16, 32, ... cells, depending on whether more control of the erasing is desired at the expense of added space for more source contacts, for example, and other design requirements.

Since the floating gates for all of the memory cells on a chip are at equal distances from the drain region, a memory cell consistent with the present invention can be manufactured easily and consistently. As shown in FIG. 2A, the distance between the floating gate formed from polysilicon layer 30 and drain region 70 from which charge is injected into the floating gate is represented by the distance L. As described in the process shown in FIGS. 1A–1K, a method consistent with the present invention for forming a memory cell can maintain a constant distance between these two regions because each region is formed using the same mask. As a result of this constant distance, the select gate for each manufactured memory cell can be automatically aligned with the drain region and floating gate.

It will be apparent to those skilled in the art that various modifications arid variations can be made to disclosed embodiments of the present invention without departing from the scope or spirit of the invention. Other embodiments of the invention will be apparent to those skilled in the art from consideration of the specification and practice of the embodiments or the invention disclosed herein. The specification and examples should be considered exemplary, with the true scope and spirit of the invention being indicated by the following claims and their full range of equivalents.

What is claimed is:

1. A method for fabricating a non-volatile memory semiconductor device, comprising:

forming an insulating layer over a semiconductor substrate of a first conductivity type;

forming a first polysilicon layer over the insulating layer;

forming a nitride layer over the first polysilicon layer such that first and second portions of the first polysilicon layer are exposed;

forming first and second insulating regions on the first and second exposed portions, respectively, of the first polysilicon layer;

removing the first insulating region and the first portion of the first polysilicon layer such that a first portion of the insulating layer below the first portion of the first polysilicon layer is exposed;

forming an impurity region of a second conductivity type in the semiconductor substrate below the first portion of the insulating layer;

removing the nitride layer; and etching the first polysilicon layer such that only the second portion of the first polysilicon layer below the second insulating region remains.

2. The method according to claim 1, further comprising:

forming a sidewall insulating layer on sidewalls of the second portion of the first polysilicon layer; and forming a second polysilicon layer over the insulating layer, the sidewall insulating layers, and the second insulating region.

3. The method according to claim 2, further comprising:

etching the second polysilicon layer such that a remaining portion of the second polysilicon layer overlies a portion of the impurity region and a portion of the second insulating region.

4. The method according to claim 3, wherein the impurity region is a first impurity region, said method further comprising:

forming a second impurity region of the second conductivity type in the semiconductor substrate on a side of the second portion of the first polysilicon layer remote from the first impurity region.

5. The method according to claim 4, wherein forming the second impurity region includes diffusing the second impurity region in the substrate so that the second portion of the first polysilicon layer overlies a portion of the second impurity region.

6. The method according to claim 2, wherein forming a sidewall insulating layer includes forming an oxide layer.

7. The method according to claim 2, wherein forming a sidewall insulating layer includes forming a composite layer of oxide/nitride.

8. The method according to claim 2, wherein forming a sidewall insulating layer includes forming a composite layer of oxide/nitride/oxide.

* * * * *